US007160126B1

(12) United States Patent
Lai

(10) Patent No.: US 7,160,126 B1
(45) Date of Patent: Jan. 9, 2007

(54) PRINTED CIRCUIT BOARD CONNECTOR WITH LOCKING DEVICE

(75) Inventor: Chih-Ming Lai, Sindian (TW)

(73) Assignee: Giga-Byte Technology Co., Ltd., Taipei County (TW)

( * ) Notice: Subject to any disclaimer, the term of this patent is extended or adjusted under 35 U.S.C. 154(b) by 0 days.

(21) Appl. No.: 11/218,645

(22) Filed: Sep. 6, 2005

(51) Int. Cl.
*H01R 13/62* (2006.01)

(52) U.S. Cl. .................................. 439/327

(58) Field of Classification Search ............ 439/327, 439/328, 630, 153, 157, 160; 361/818; 248/27.3
See application file for complete search history.

(56) References Cited

U.S. PATENT DOCUMENTS

| | | | | |
|---|---|---|---|---|
| 4,826,447 A | * | 5/1989 | Forker et al. ............ | 439/328 |
| 6,017,004 A | * | 1/2000 | Grantham ................ | 248/27.3 |
| 6,123,471 A | * | 9/2000 | Harb et al. .............. | 400/248 |
| 6,210,195 B1 | * | 4/2001 | Ma ........................ | 439/327 |
| 6,709,283 B1 | * | 3/2004 | Lai ........................ | 439/327 |

* cited by examiner

*Primary Examiner*—Alexander Gilman
(74) *Attorney, Agent, or Firm*—Rosenberg, Klein & Lee

(57) ABSTRACT

A locking device has a blocking member, a first operating unit and a second operating unit. The blocking member is provided for blocking a printed circuit board under a locking position when the printed circuit board is installed into the printed circuit board connector, so as to retain the printed circuit board within the printed circuit board connector. Furthermore, the blocking member is removed from the locking position by operating either the first operating unit or the second operating unit. The first operating unit and the second operating unit are spaced from each other and mounted to different positions, so as to benefit from applying either the first operating unit or the second operating unit to remove the locking position when either the first operating unit or the second operating unit is obstructed by other devices.

10 Claims, 6 Drawing Sheets

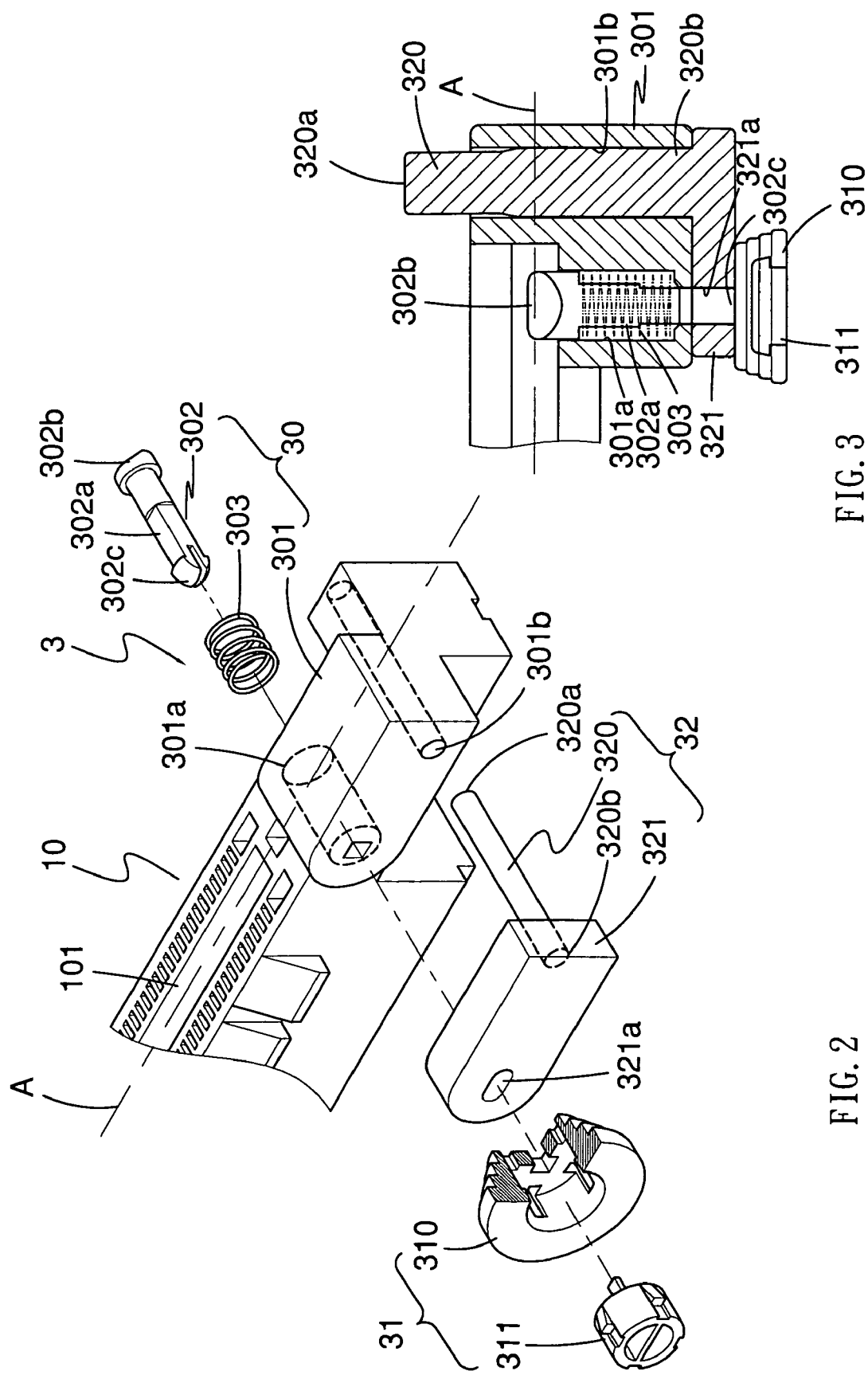

PRINTED CIRCUIT BOARD CONNECTOR WITH LOCKING DEVICE

TECHNICAL FIELD

This invention relates generally to a printed circuit board connector, and particularly to an interface card connector with a locking device, which is provided for locking/unlocking an interface card.

BACKGROUND OF THE INVENTION

FIG. 9 shows a conventional printed circuit board connector 8 and a printed circuit board 9. The printed circuit board connector 8 has a locking device 80, which is provided for locking the printed circuit board 9, so as to retain the printed circuit board 9 within the printed circuit board connector 8.

However, other devices with certain dimensions, such as a heatsink devices and a fan 90, mounted to the printed circuit board 9 somehow obstruct a great portion of the locking device 80, especially an operating unit 801 of the locking device 80, after the printed circuit board 9 is installed into the printed circuit board connector 8. Therefore, a user has difficulty in use of the operating unit 901 of the locking device 80 to lock/unlock the printed circuit board 9.

Furthermore, German Utility Model Nos. 20219744.1 and 20219746.8, French Utility Model Nos. 0216604 and 0216603, British Patent Nos. 2383903 and 2396488, Japanese Utility Model Nos. 3094987 and 3094988, Taiwanese Utility Model Nos. 205196 and 222087, American Patents U.S. Pat. Nos. 6,709,283 and 6,767,230, and Chinese Utility Model No. ZL 02202129.9 disclose similar structures as the above-mentioned conventional structures respectively. Moreover, American patents U.S. Pat. Nos. 4,826,447, 4,579,411, 5,650,917, 6,379,168, 6,551,120, 5,302,133, 6,425,778, 6,368,124 and 6,358,079 also disclose printed circuit board connectors with locking devices. Although these printed circuit board connectors have different structures, similar problems as above-mentioned to the locking devices still remain.

SUMMARY OF INVENTION

The primary objective of the present invention is to provide a locking device and a printed circuit board connector applying to the locking device. The locking device is installed to a side of the printed circuit board connector for locking a printed circuit board, which is installed into the printed circuit board connector. Alternatively, the locking device can be formed integrally with the side of the printed circuit board connector or be formed separately near to the side of the printed circuit board connector.

More particularly, in one embodiment of the present invention, the printed circuit board connector has an elongate slot and a locking device. The locking device comprises a blocking member, a first operating unit and a second operating unit. The blocking member is provided for blocking the printed circuit board under a locking position when the printed circuit board is installed into the elongate slot, so as to retain the printed circuit board within the elongate slot. In addition, the first operating unit and the second operating unit are respectively provided for removing the blocking member from the locking position by exerting a first force and a second force. In other words, the locking position is removed by either the first operating unit or the second operating unit. The first operating unit and the second operating unit are spaced from each other and mounted to different positions, so as to be operated alternatively by either the first operating unit or the second operating unit when either of the first operating unit and the second operating unit is obstructed by other devices.

Preferably, the first operating unit and the second operating unit are operated respectively from two opposite longitudinal sides of the printed circuit board connector. The first force exerted to the first operating unit is a pull force and the second force exerted to the second operating unit is a push force.

Therefore, the present invention applies the first operating unit and the second operating unit to remove the blocking member of the locking device respectively. When either of the first operating unit and the second operating unit of the locking device is obstructed by other devices, the user can easily use either the first operating unit or the second operating unit to lock/unlock the printed circuit board.

BRIEF DESCRIPTION OF DRAWINGS

The invention will be more clearly understood after referring to the following detailed description read in conjunction with the drawings, wherein:

FIG. 2 is a partial exploded view of the first embodiment of the present invention, showing a structure of a locking device;

FIG. 3 is a partial cross sectional view of the first embodiment of the present invention, showing the structure of the locking device;

DETAILED DESCRIPTION OF PREFERRED EMBODIMENTS

Figure 1:
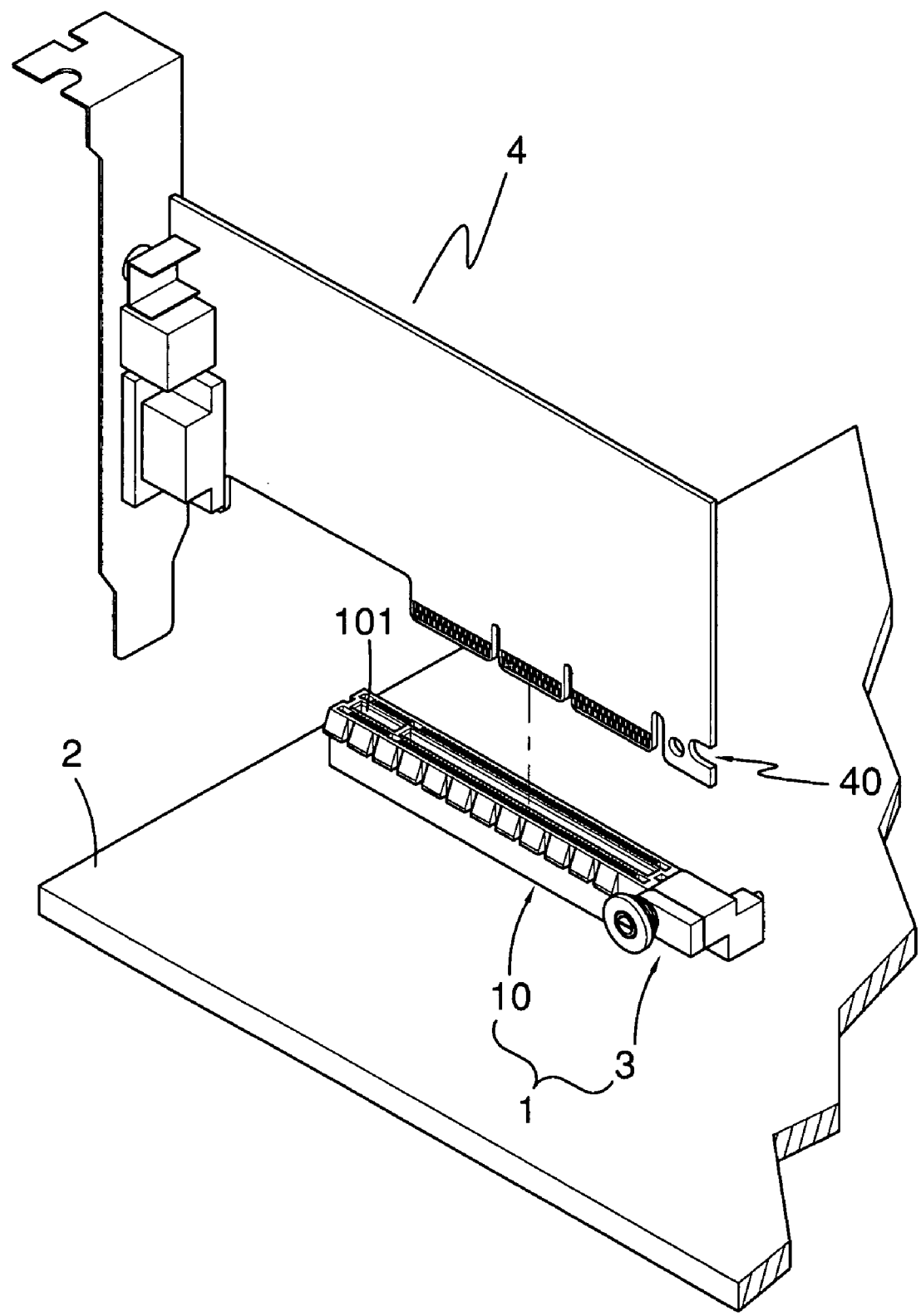
FIG. 1 is a perspective view of a first embodiment of the present invention.

FIG. 1 shows a first embodiment of the present invention, which indicates a printed circuit board connector 1 is mounted to a motherboard 2. The printed circuit board connector 1 comprises a housing 10, an elongate slot 101 and a locking device 3. The housing 10 is secured onto the motherboard 2 and the elongate slot 101 is formed on the housing 10 for installing a printed circuit board 4, which forms with a notch 40 on a side of the printed circuit board 4. In the first embodiment, the motherboard 2 is a personal computer motherboard, the printed circuit board 4 is a VGA card, and the printed circuit board connector 1 is a PCI connector.

In FIG. 2, the locking device 3 comprises a blocking member 30, a first operating unit 31 and a second operating unit 32. The blocking member 30 comprises an extension support 301, a retainer 302 and a resilient element 303. The extension support 301 extends from the housing 10 and has a channel 301a and a though hole 301b, which is parallel to the channel 301a. The retainer 302 has a body 302a, a head 302b and a tail 302c. The head 302b and the tail 302c are formed on two opposite ends of the body 302a respectively. FIG. 3 further shows the body 302a is installed within the channel 301a, and the head 302b and the tail 302c extend out of the channel 301a. The resilient element 303 is a compression spring and is mounted around the body 302a. Moreover, the head 302b extends to a position, which corresponds to an extension line A extended from the elongate slot 101 longitudinally. In other words, the position of the head 302b is designed for corresponding to the notch 40 of the printed circuit board 4.

As shown in FIGS. 2–3, the first operating unit 31 is formed into a pull button shape and comprises a button 310 and a fastener 311. The tail 302c of the retainer 302 inserts into the button 310 through the channel 301a and is fastened to the button 310 by the fastener 311, which is fastened within the button 310 for securing the button 310 and the tail 302c from detachment.

Furthermore, the second operating unit 32 comprises a pin 320 and a connecting plate 321. The pin 320 has a first end 320a and a second end 320b. The connecting plate 321 has one side connected to the second end 320b of the pin 320 and another side formed with an opening 321a. In FIG. 3, the tail 302c of the retainer 302 also passes through the opening 321a and inserts into the button 310. The pin 320 is inserted into the through hole 301b, and the first end 320a and the second end 320b extends out of the through hole 301b respectively.

Figure 4:
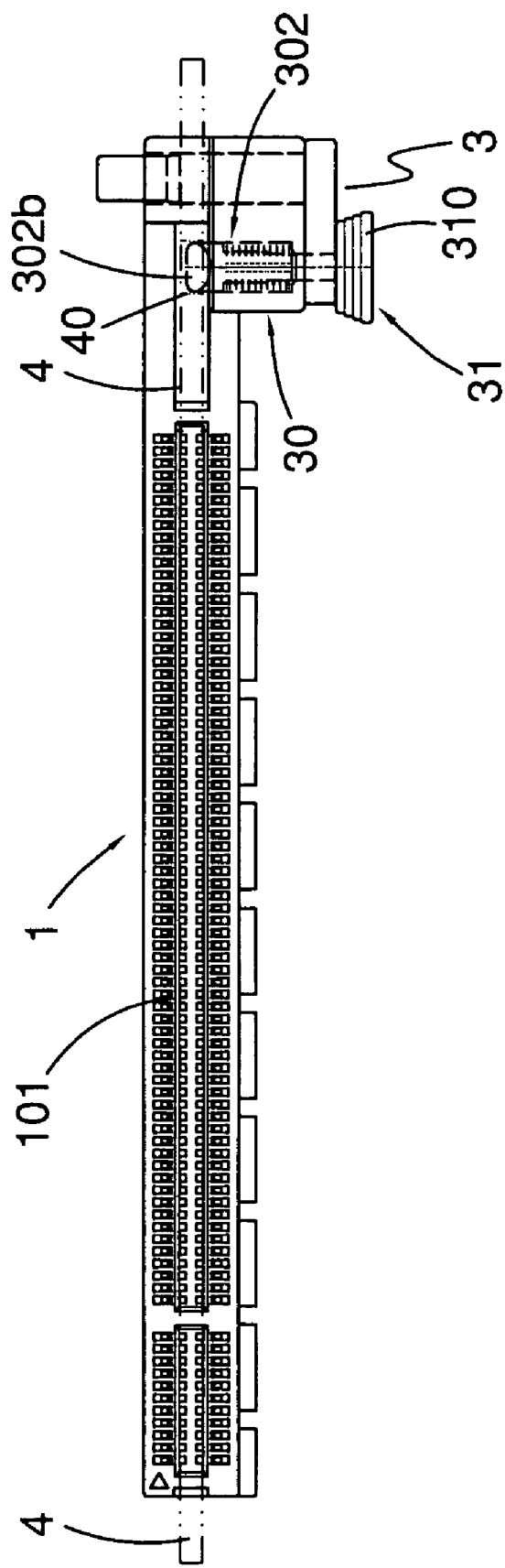
FIG. 4 is a top view of the first embodiment of the present invention, showing a printed circuit board being locked by the locking device.

FIG. 4 shows the printed circuit board 4 is installed into the elongate slot 101 of the printed circuit board connector 1 and the blocking member 30 of the locking device 3 is in a locking position to lock the printed circuit board 4. In the locking position, the head 302b of the retainer 302 is inserted into the notch 40 of the printed circuit board 4 to block the printed circuit board 4, so as to retain the printed circuit board 4 within the elongate slot 101. In other words, the printed circuit board 4 is locked on the printed circuit board connector 1 by the locking device 3 to prevent the printed circuit bard 4 from removing.

Figure 5:
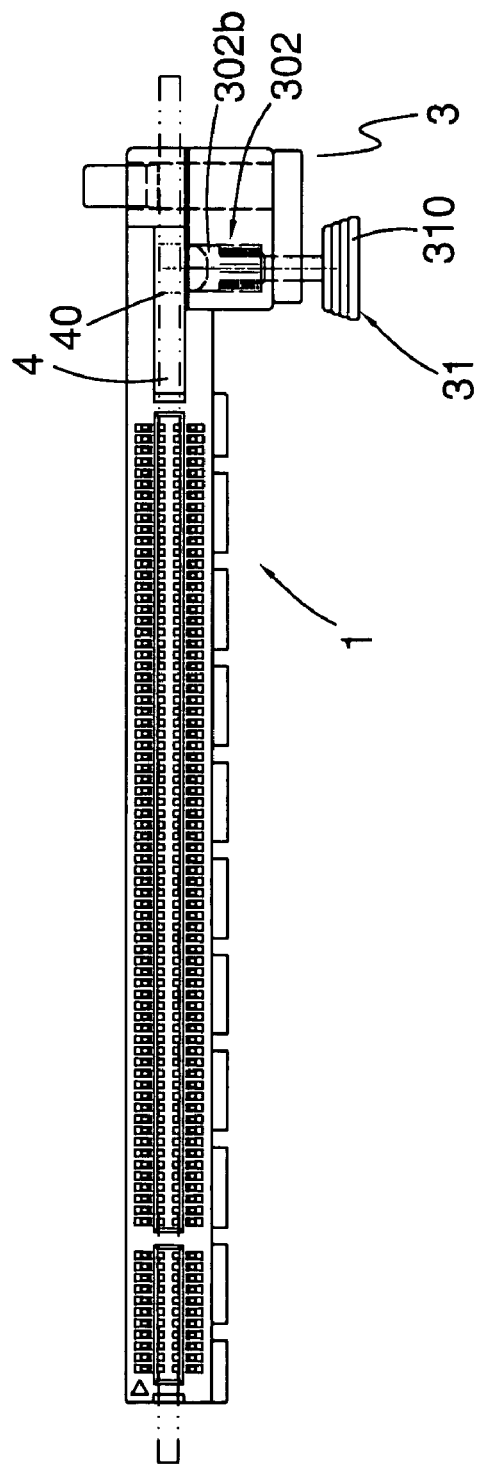
FIG. 5 is a top view of the first embodiment of the present invention, showing the printed circuit board being unlock by a first operating unit.

FIG. 5 further shows the first operating unit 31 is operated. A user can exert a first force, namely a pull force, to pull the button 310 of the first operating unit 31 for moving the retainer 302 away from the locking position, so as to remove the head 302b of the retainer 302 from the notch 40 of the printed circuit board 4. Therefore, the printed circuit board 4 is unlocked and can be withdrawn from the printed circuit board connector 1.

Figure 6:
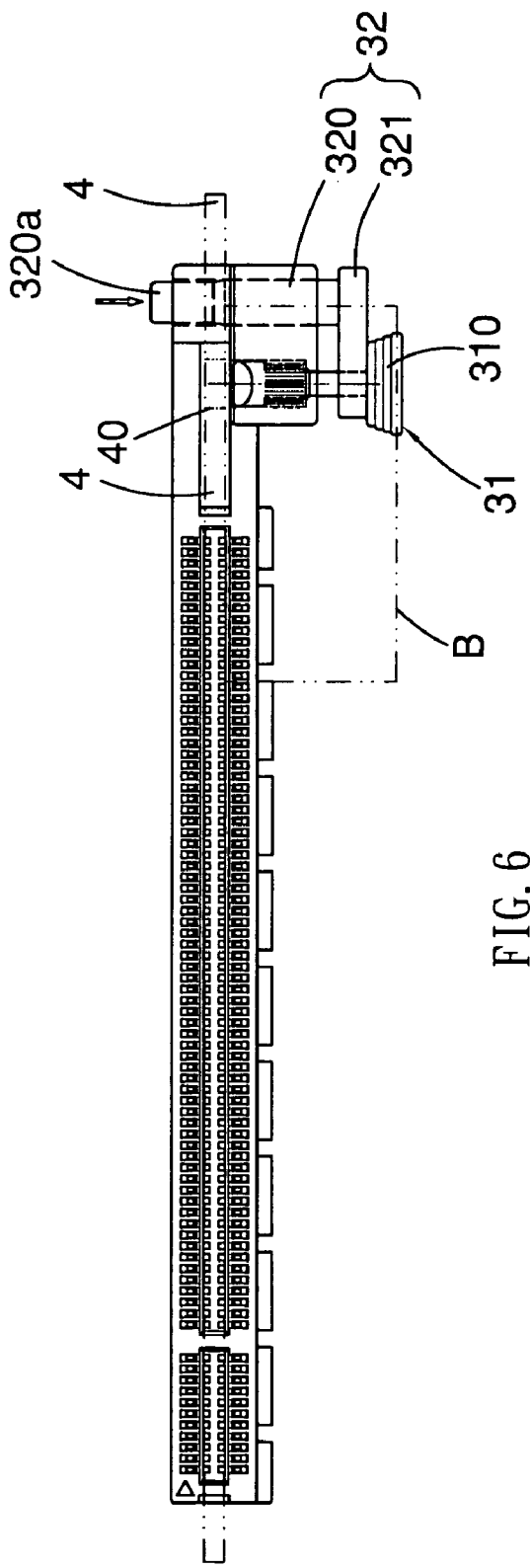
FIG. 6 is a top view of the first embodiment of the present invention, showing the printed circuit board being unlock by a second operating unit.

As shown in FIG. 6, a device B with certain dimension and height is mounted to the printed circuit board 4. The device B, such as a heatsink device or a fan, usually blocks the first operating unit 31 when the printed circuit board 4 is installed into the elongate slot 101. As a result, the user can use the second operating unit 32 and exert a second force, namely the push force, to push the first end 320a of the pin 320 for driving the connecting plate 321 to move the button 310 of the first operating unit 31. Accordingly, the button 310 of the first operating unit 31 is moved to a distance by the second operating unit 32 that make the head 302b of the retainer 302 to move correspondingly and the head 302b of the retainer 302 is removed from the notch 40 of the printed circuit board 4. Thus, the printed circuit board 4 is unlocked by the second operating unit 32.

In addition, when the retainer 302 removes from the locking position, the resilient element 303 restores resilience for restoring the retainer 302 due to compression of the resilient element 303. Therefore, the retainer 302 can restore to the locking position by the resilient element 303 as long as the user stops operating the first operating unit 31 and the second operating unit 32.

Figure 7:
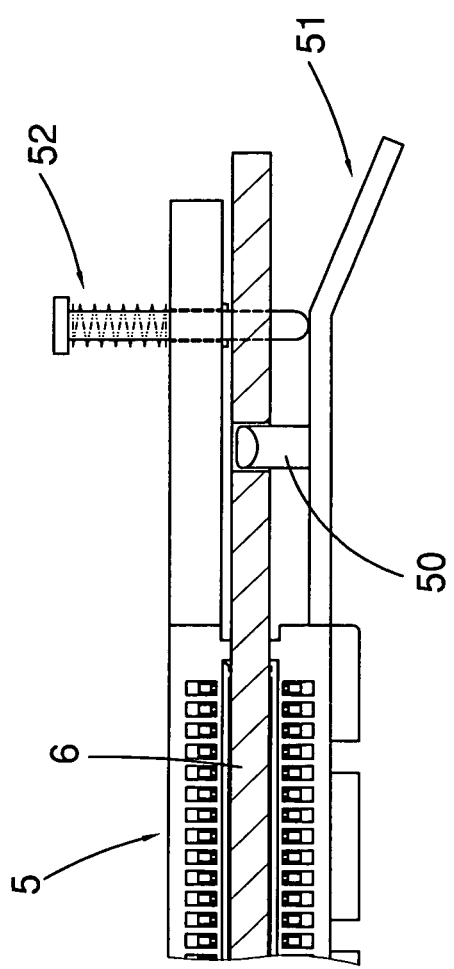
FIG. 7 is a partial top cross sectional view of a second embodiment of the present invention, showing a structure of a locking device.
Figure 8:
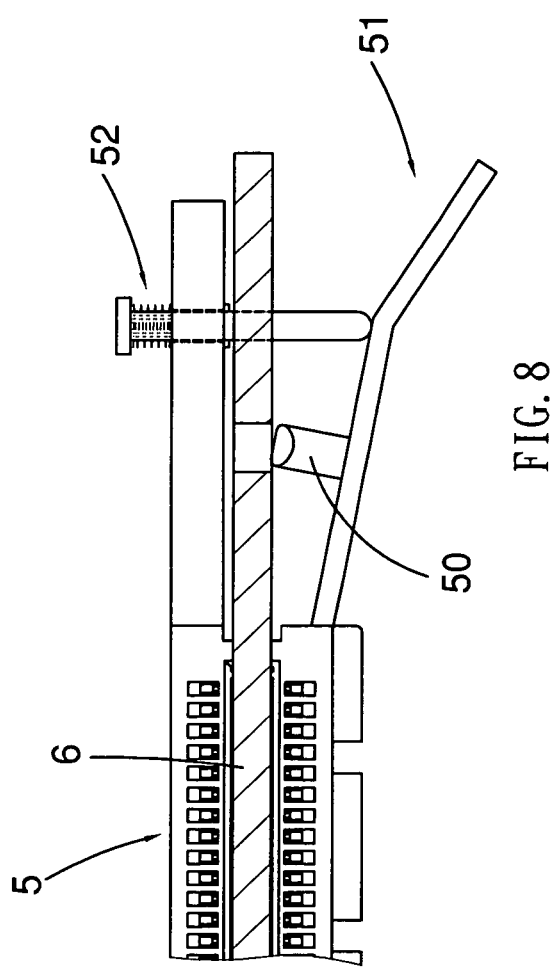
FIG. 8 is a partial top cross sectional view of the second embodiment of the present invention, showing a printed circuit board being unlock by a second operating unit.
Figure 9:
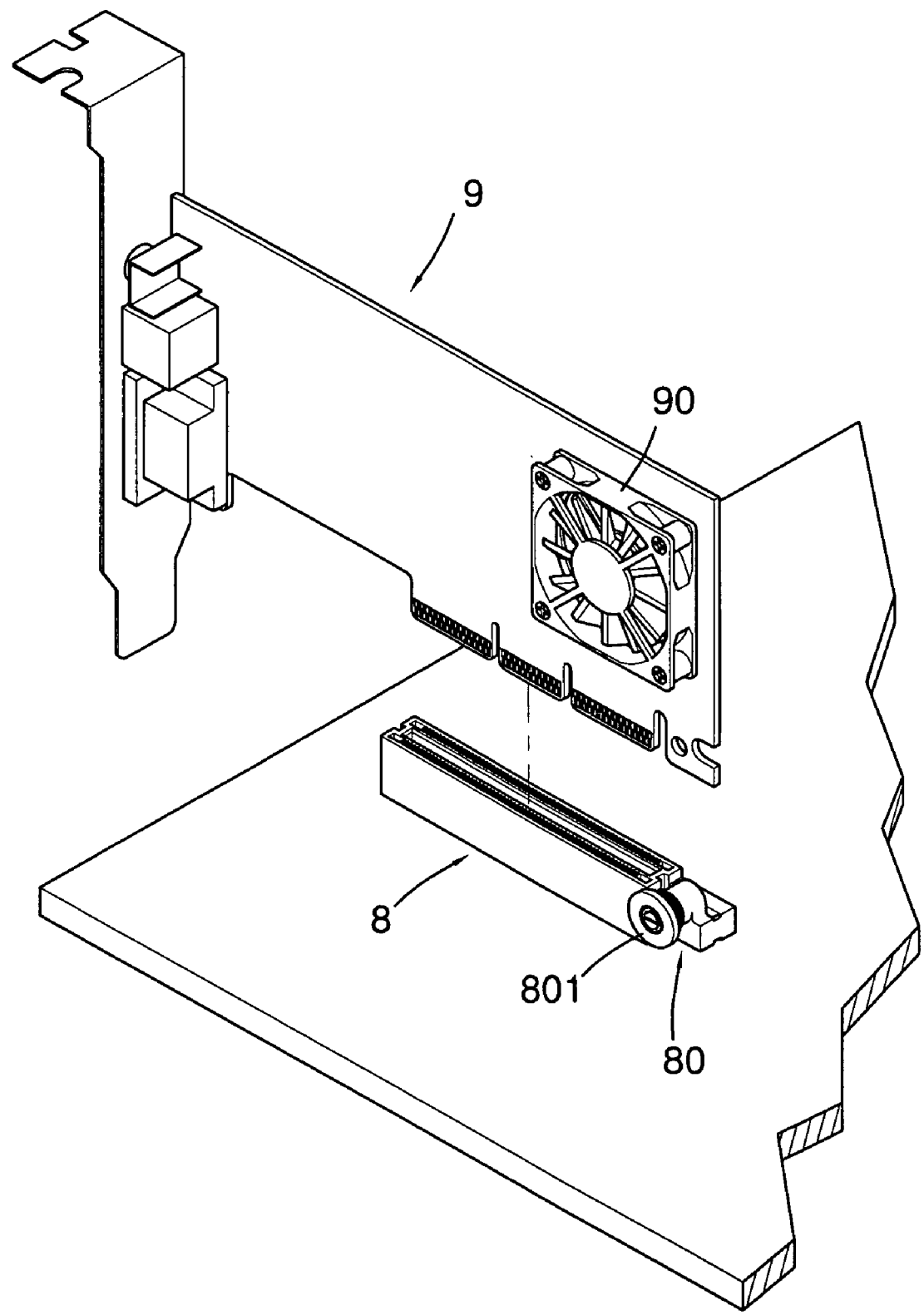
FIG. 9 is a perspective view of a conventional printed circuit board connector for installing a printed circuit board.

FIGS. 7–8 show a second embodiment of the present invention. In FIG. 7, a printed circuit board connector 5 with a locking device, which comprises a blocking member 50, a first operating unit 51 and a second operating unit 52. The blocking member 50 is a plug and the first operating unit 51 is a resilient plate. The plug is formed on the resilient plate and is used to block a printed circuit board 6 installed into the printed circuit board connector 5, similar to the retainer 302 of the first embodiment. Therefore, the user can unlock the printed circuit board 6 by operating the first operating unit 51 to remove the blocking member 50 away from the printed circuit board 6 as long as the first operating unit 51 is not obstructed by other devices. Furthermore, FIG. 8 shows the second operating unit 52 can be operated by the user when the first operating unit 51 is obstructed. The user can push the second operating unit 52 to remove the blocking member 50 away from the printed circuit board 6.

In the first and the second embodiments, the present invention applies either of the first operating unit and the second operating unit to remove the blocking member of the locking device, so as to unlock the installed printed circuit board. More importantly, the first operating unit and the second operating unit are spaced out a certain distance from each other for the user to operate separately. Furthermore, the first operating unit and the second operating unit can be mounted to the same side, the opposite sides, the adjacent sides, two longitudinal sides or two short sides of the printed circuit board connector as long as either of the first operating unit and the second operating unit can be operated. Accordingly, the user can easily use either the first operating unit or the second operating unit to lock/unlock the printed circuit board by the present invention.

Numerous characteristics and advantages of the invention have been set forth in the foregoing description, together with details of the structure and function of the invention, and the novel features thereof are pointed out in appended claims. The disclosure, however, is illustrated only, and changes may be made in detail, especially, in matters of shape, size and arrangement of parts, materials and the combination thereof within the principle of the invention, to the full extent indicated by the broad general meaning of the terms in which the appended claims are expressed.

We claim:

1. A printed circuit board connector, having an elongate slot and a locking device, the locking device comprising:
   a blocking member, provided for blocking a printed circuit board under a locking position when the printed circuit board is installed into the elongate slot, so as to retain the printed circuit board within the elongate slot;
   a first operating unit defining a first actuating portion, provided for removing the blocking member from the locking position responsive to a first force exerted upon the first actuating portion; and
   a second operating unit defining a second actuating portion spaced from the first actuating portion of the first operating unit and provided for removing the blocking member from the locking position responsive to a second force exerted upon the second actuating portion;

the first operating unit or the second operating unit being actuable independent of the other to remove the blocking member from the locking position.

2. The printed circuit board connector of claim 1, wherein the first force is a pull force and the second force is a push force.

3. The printed circuit board connector of claim 1, wherein the first force is exerted to the first operating unit from one side of the elongate slot and the second force is exerted to the second operating unit from another side of the elongate slot.

4. The printed circuit board connector of claim 1, wherein the first force is exerted to the first operating unit from one longitudinal side of the elongate slot and the second force is exerted to the second operating unit from another longitudinal side of the elongate slot.

5. A printed circuit board connector, comprising:
a housing, having an elongate slot for installing a printed circuit board, which has a notch thereon; and
a locking device, comprising:
a blocking member, comprising an extension support extending from the housing, and a retainer movably installed to the extension support for blocking the notch of the printed circuit board when the printed circuit board is installed into the elongate slot of the housing;
a first operating unit defining a first actuating portion, connected to the retainer for removing the retainer from the notch of the printed circuit board; and
a second operating unit defining a second actuating portion spaced from the first actuating portion of the first operating unit and connected to the retainer for removing the retainer from the notch of the printed circuit board;
the first operating unit or the second operating unit being actuable independent of the other to remove the blocking member from the locking position.

6. The printed circuit board connector of claim 5, wherein the blocking member further comprises a resilient element installed between the extension support and the retainer for storing resilience when the retainer is removed from the notch of the printed circuit board, so as to restore the retainer to a locking position.

7. The printed circuit board connector of claim 6, wherein:
the extension support has a channel;
the retainer has a body, a head and a tail, the body being installed within the channel, the head and the tail being formed on two opposite ends of the body respectively, wherein the head and the tail extends out of the channel and the head is provided for blocking the notch of the printed circuit board;
the resilient element is a compression spring mounted around the body of the retainer; and
the first operating unit is formed into a pull button shape and is connected to the tail of the retainer.

8. A printed circuit board connector comprising:
a housing, having an elongate slot for installing a printed circuit board, which has a notch thereon; and
a locking device, comprising:
a blocking member, comprising an extension support extending from the housing, and a retainer movably installed to the extension support for blocking the notch of the printed circuit board when the printed circuit board is installed into the elongate slot of the housing;
a first operating unit defining a first actuating portion, connected to the retainer for removing the retainer from the notch of the printed circuit board; and
a second operating unit defining a second actuating portion spaced from the first actuating portion of the first operating unit and connected to the retainer for removing the retainer from the notch of the printed circuit board;
wherein:
the extension support has a through hole; and
the second operating unit comprises:
a pin, installed in the through hole and having a first end and a second end, the first end and the second end extending out of the through hole respectively; and
a connecting plate, having one side connected to the second end of the pin and another side connected to the first operating unit.

9. A printed circuit board connector comprising:
a housing, having an elongate slot for installing a printed circuit board, which has a notch thereon; and
a locking device, comprising:
a blocking member, comprising an extension support extending from the housing, and a retainer movably installed to the extension support for blocking the notch of the printed circuit board when the printed circuit board is installed into the elongate slot of the housing;
a first operating unit defining a first actuating portion, connected to the retainer for removing the retainer from the notch of the printed circuit board, and
a second operating unit defining a second actuating portion spaced from the first actuating portion of the first operating unit and connected to the retainer for removing the retainer from the notch of the printed circuit board,
wherein:
the blocking member further comprises a resilient element installed between the extension support and the retainer for storing resilience when the retainer is removed from the notch of the printed circuit board, so as to restore the retainer to a locking position;
the extension support has a channel;
the retainer has a body, a head and a tail, the body being installed within the channel, the head and the tail being formed on two opposite ends of the body respectively, wherein the head and the tail extends out of the channel and the head is provided for blocking the notch of the printed circuit board;
the resilient element is a compression spring mounted around the body of the retainer;
the first operating unit is formed into a pull button shape and is connected to the tail of the retainer;
the extension support has a through hole, which is parallel to the channel; and
the second operating unit comprises:
a pin, installed in the through hole and having a first end and a second end, the first end and the second end extending out of the through hole respectively; and
a connecting plate, having one side connected to the second end of the pin and another side formed with an opening for the tail of the retainer passing through.

10. A locking device, provided for installing to a side of a printed circuit board connector, so as to lock a printed circuit board when the printed circuit board is installed into the printed circuit board connector, wherein the locking device has a blocking member, a first operating unit and a second operating unit, the blocking member being provided for blocking the printed circuit board under a locking position when the printed circuit board is installed into the printed circuit board connector, so as to retain the printed circuit board within the printed circuit board connector, and the blocking member being removed from the locking position by operating either the first operating unit or the second operating unit, wherein the first operating unit and the second operating unit are operated respectively from two opposite longitudinal sides of the printed circuit board connector.

* * * * *